US009306107B2

(12) United States Patent
Hong et al.

(10) Patent No.: US 9,306,107 B2
(45) Date of Patent: *Apr. 5, 2016

(54) BUFFER LAYER FOR HIGH PERFORMING AND LOW LIGHT DEGRADED SOLAR CELLS

(71) Applicant: INTERNATIONAL BUSINESS MACHINES CORPORATION, Armonk, NY (US)

(72) Inventors: Augustin J. Hong, White Plains, NY (US); Marinus J. Hopstaken, Carmel, NY (US); Jeehwan Kim, White Plains, NY (US); John A. Ott, Greenwood Lake, NY (US); Devendra K. Sadana, Pleasantville, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/966,917

(22) Filed: Aug. 14, 2013

(65) Prior Publication Data

US 2014/0216534 A1    Aug. 7, 2014

Related U.S. Application Data

(63) Continuation of application No. 13/760,509, filed on Feb. 6, 2013, now abandoned.

(51) Int. Cl.
*H01L 31/0376* (2006.01)
*H01L 31/075* (2012.01)
*H01L 31/20* (2006.01)

(52) U.S. Cl.
CPC ........ *H01L 31/075* (2013.01); *H01L 31/03762* (2013.01); *H01L 31/03767* (2013.01); *H01L 31/202* (2013.01); *Y02E 10/548* (2013.01); *Y02P 70/521* (2015.11)

(58) Field of Classification Search
CPC ... H01L 31/0527; H01L 31/042; H01L 31/04; H01L 31/0522; H01L 21/02304; H01L 31/045; H01L 31/202; H01L 31/03767; H01L 31/03762; H01L 31/075

See application file for complete search history.

(56) References Cited

U.S. PATENT DOCUMENTS

| 6,242,686 | B1 * | 6/2001 | Kishimoto et al. | 136/255 |
|---|---|---|---|---|
| 7,301,215 | B2 | 11/2007 | Kariya | |
| 7,883,789 | B2 | 2/2011 | Sato et al. | |

(Continued)

OTHER PUBLICATIONS

Landweer, G.e.n, and P. Roca I Cabarrocas. "Photoemission Measurements on Aluminium and Amorphous Silicon by Pulsed Laser Illumination in Presence of a Plasma." Applied Surface Science 109-110 (1997): 579-83. Web.*

(Continued)

*Primary Examiner* — Jarrett Stark
*Assistant Examiner* — Bitew Dinke
(74) *Attorney, Agent, or Firm* — Tutunjian & Bitetto, P.C.; Louis J. Percello (57) ABSTRACT

Methods for forming a photovoltaic device include forming a buffer layer between a transparent electrode and a p-type layer. The buffer layer includes a doped germanium-free silicon base material. The buffer layer has a work function that falls within barrier energies of the transparent electrode and the p-type layer. An intrinsic layer and an n-type layer are formed on the p-type layer. Devices are also provided.

9 Claims, 6 Drawing Sheets

(56) References Cited

U.S. PATENT DOCUMENTS

| | | |
|---|---|---|
| 2007/0137695 A1 | 6/2007 | Fetzer et al. |
| 2007/0248768 A1* | 10/2007 | Loboda et al. ............... 427/574 |
| 2007/0272297 A1* | 11/2007 | Krivoshlykov et al. ....... 136/256 |
| 2008/0105299 A1* | 5/2008 | Krasnov ........................ 136/256 |
| 2008/0188033 A1* | 8/2008 | Choi et al. ...................... 438/96 |
| 2009/0133753 A1* | 5/2009 | Sasaki et al. .................. 136/261 |
| 2009/0272423 A1* | 11/2009 | Niira et al. .................... 136/244 |
| 2010/0096004 A1 | 4/2010 | Hu et al. |
| 2010/0163100 A1 | 7/2010 | Goya et al. |
| 2010/0282308 A1 | 11/2010 | Okamoto |
| 2010/0307574 A1* | 12/2010 | Matsumoto et al. .......... 136/255 |
| 2011/0088760 A1* | 4/2011 | Sheng et al. ................... 136/255 |
| 2011/0120536 A1 | 5/2011 | Wang et al. |
| 2011/0126893 A1* | 6/2011 | Myong ........................... 136/255 |
| 2011/0180130 A1 | 7/2011 | Krasnov et al. |
| 2011/0186122 A1 | 8/2011 | Moon et al. |
| 2011/0232754 A1* | 9/2011 | Myong ........................... 136/258 |
| 2011/0272010 A1* | 11/2011 | Abou-Kandil et al. ....... 136/255 |
| 2011/0308583 A1* | 12/2011 | Joshi et al. .................... 136/255 |
| 2012/0055534 A1* | 3/2012 | Leschkies et al. ............ 136/244 |
| 2012/0080081 A1 | 4/2012 | Klein et al. |
| 2012/0125437 A1 | 5/2012 | Okawara et al. |
| 2012/0152352 A1* | 6/2012 | Chen et al. .................... 136/261 |
| 2013/0061915 A1* | 3/2013 | Myong et al. ................. 136/255 |
| 2013/0221373 A1* | 8/2013 | Chen et al. ...................... 257/77 |
| 2013/0221464 A1* | 8/2013 | Fogel et al. ................... 257/432 |
| 2013/0224899 A1* | 8/2013 | Abou-Kandil et al. ......... 438/72 |
| 2014/0127853 A1* | 5/2014 | Chen ............... H01L 31/022483 438/98 |
| 2015/0136210 A1* | 5/2015 | Multone et al. ............... 136/255 |

OTHER PUBLICATIONS

Yang Li, Liu Xingyuan, Wu Chunya, Meng Zhiguo, Wang Yi, and Xiong Shaozhen. "Tricolor Microcavity OLEDs Based on P-nc-Si:H Films as the Complex Anodes." Journal of Semiconductors 30.6 (2009): 063005. Web.*

Final Office Action mailed on May 1, 2014 for U.S. Appl. No. 13/760,509.

Office Action mailed on May 27, 2014 for U.S. Appl. No. 13/407,006.

Ballutaud, J., et al. "Reduction of the Boron Cross-Contamination for Plasma Deposition of P—I—N. Devices in a Single-Chamber Large Area Radio-Frequency Reactor" Thin Solid Films, vol. 468, Issues 1-2. Dec. 2004. pp. 222-225.

Lundszien, D., et al. "Band-Gap Profiling in Amorphous Silicon—Germanium Solar Cells" Applied Physics Letters, vol. 80, No. 9. Mar. 2002. pp. 1655-1657.

* cited by examiner

BUFFER LAYER FOR HIGH PERFORMING AND LOW LIGHT DEGRADED SOLAR CELLS

RELATED APPLICATION INFORMATION

This application is a Continuation application of co-pending U.S. patent application Ser. No. 13/760,509 filed on Feb. 6, 2013, incorporated herein by reference in its entirety. This application is related to commonly assigned application Ser. No. 13/407,006 filed on Feb. 28, 2012, incorporated herein by reference.

BACKGROUND

1. Technical Field

The present invention relates to photovoltaic devices and methods for fabrication, and more particularly to devices, structures and fabrication methods that reduce light-induced degradation and increase performance by employing a silicon buffer layer between an electrode and a p+ doped layer in a photovoltaic cell.

2. Description of the Related Art

When a hydrogenated amorphous silicon solar cell (a-Si:H) is soaked in solar radiation, efficiency of the cell is degraded as soaking time increases. Such phenomenon has not been observed for other types of solar cells. This is called the Staebler-Wronski effect. According to conventional theory of the Staebler-Wronski effect (SW effect), hydrogen is reconfigured increasing hydrogen passivation of silicon base materials of the solar cell under photon illumination. The solar cell experiences reduced fill factor (FF) and reduced open circuit voltage ($V_{oc}$) both of which reduce the efficiency of the solar device.

A barrier height or barrier is a difference between work functions between different materials. The barrier is affected by the type of material with which a semiconductor is in contact. A band offset is the measure of misalignment between energy levels at the interface between two solids. The offset between an electrode and a semiconductor is called a "Schottky barrier". The barriers and offsets are measures of how much a given material resists the flow of electrical charge through a medium. These quantities are also negatively affected in solar cells by light induced cell degradation. Both semiconductor-semiconductor band offset and semiconductor-electrode Schottky barrier increase the SW effect.

The barrier height between an electrode and a doped semiconductor layer may be high. To reduce the barrier height and therefore reduce Schottky barrier formation, a buffer layer may be employed. The buffer layer selected for amorphous silicon solar cells is typically Ge, which is good for reducing light degradation. However, Ge absorbs light and is prone to structural defects, which may degrade performance.

SUMMARY

Methods for forming a photovoltaic device include forming a buffer layer between a transparent electrode and a p-type layer. The buffer layer includes a doped germanium-free silicon base material. The buffer layer has a work function that falls within barrier energies of the transparent electrode and the p-type layer. An intrinsic layer and an n-type layer are formed on the p-type layer.

Another method for forming a photovoltaic device includes forming a transparent electrode on a transparent substrate; depositing a buffer layer on the transparent electrode, the buffer layer being deposited by a plasma enhanced chemical vapor deposition process at a deposition power to provide a doped germanium-free noncrystalline silicon layer with a work function that falls substantially in a middle of a barrier formed between adjacent layers to the buffer layer to provide resistance to light induced degradation and reduce a Schottky barrier; depositing a p-type layer on the buffer layer; forming an intrinsic layer on the p-type layer; forming an n-type layer on the intrinsic layer; and forming a back electrode on the n-type layer.

A photovoltaic device includes a transparent electrode formed on a transparent substrate. A buffer layer is formed on the transparent electrode. The buffer layer is formed from a doped germanium-free silicon layer. A p-type layer is formed on the buffer layer such that the work function of the buffer layer falls substantially within a barrier formed between the transparent electrode and the p-type layer. An intrinsic layer is formed on the p-type layer, an n-type layer is formed on the intrinsic layer and a back electrode is formed on the n-type layer.

A solar cell structure includes a glass substrate, a transparent electrode formed on the glass substrate and a buffer layer formed on the transparent electrode. The buffer layer is formed from a doped germanium-free silicon layer and has a light transmittance of greater than 80% in visible light. A p-type layer is formed on the buffer layer such that the work function of the buffer layer falls substantially within a barrier formed between the transparent electrode and the p-type layer. An intrinsic layer is formed on the p-type layer, an n-type layer is formed on the intrinsic layer and a back electrode is formed on the n-type layer.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

In accordance with the present principles, methods and devices are presented that provide a new buffer layer that reduces cost, improves efficiency and resists light induced degradation. The present principles provide the buffer layer between an electrode and a p+ amorphous silicon (a-Si) layer in a photovoltaic stack of a device. The buffer layer employs silicon material to better align energy levels between the semiconductor layer (p+ doped layer) and the electrode. This significantly reduces the barrier height to reduce the significance of Schottky barrier formation. The buffer layer in accordance with the present principles has been found to reduce light induced degradation when formed using a low power process.

Light induced degradation occurs in a semiconductor structure when the structure becomes saturated by incoming radiation (light soaked). The structure begins to degrade due in part to the reconfiguration of hydrogen atoms, which results in passivation and bond breaking between constituent materials. This degradation process becomes prominent if there exists a band offset at a p-i (p-layer to intrinsic layer) interface and/or at a transparent conductive oxide (TCO) electrode to $p^+$ interface.

A band offset describes the relative alignment (e.g., misalignment) of the energy bands between materials at a semiconductor heterojunction. Band offset at the electrode/p+ layer is unavoidable since all developed electrodes include transparent conductive oxide (TCO) films, which are all n-type. In particularly useful embodiments, photovoltaic devices are constructed using materials and processes that reduce the risk of light-induced degradation. The buffer layer that is formed between the electrode and the $p^+$ layer of the device provides improved light degradation efficiency when formed under certain conditions. The buffer layer has a work function selected in accordance with material selection and processing parameters, including deposition power (e.g., power density), to provide a work function that bridges the work functions of adjacent materials. A work function is the minimum energy needed to remove an electron from a solid to a point immediately outside the solid surface (or energy needed to move an electron from the Fermi level into vacuum).

A band gap is an energy range in a solid where no electron states can exist. The band gap generally refers to the energy difference between a top of a valence band and a bottom of a conduction band in insulators and semiconductors. This is equivalent to the energy needed to free an outer shell electron from its orbit about the nucleus to become a mobile charge carrier, able to move freely within the solid material. The buffer layer forms an intermediate band gap layer between the electrode (TCO) and p+ layers. In one embodiment, a conduction band ($E_c$) is aligned between the buffer layer and the p-type layer.

In accordance with the present principles, a buffer layer whose work function is located in the middle of the barrier formed between two adjacent materials (e.g., between the electrode (TCO) and the p+ layer) provides minimal light degradation. The middle of the barrier includes an energy preferably within about 10% on either side of the exact middle of the barrier although improvement may be realized for greater differences from the middle. The exact middle energy is preferred to improve and optimize degradation efficiency.

Methods and devices are provided that utilize the characteristics of the buffer layer to improve degradation efficiency. In cells including a-Si, Ge forms a good buffer layer; however, during the formation of an a-Si device, an additional gas source is needed to form the Ge buffer layer. This increases the fabrication cost. In addition, a Ge buffer layer absorbs more light than a Si buffer layer provided in accordance with the present embodiments. In particularly useful embodiments, the buffer layer includes a hydrogenated Si (Si:H) and is disposed between the electrode layer and the $p^+$ layer of the photovoltaic device. The buffer layer is substantially germanium-free, and germanium is not employed in the processing. The Si:H is deposited in a low power deposition process to adjust the work function, resulting in increased resistance to light degradation effects.

In particular, when Si:H is deposited at low power, e.g., less than 50 W, preferably less than or equal to about 25 W. The Si:H is preferably amorphous hydrogenated Si (a-Si:H) and is formed so that the work function is optimal to provide minimal light degradation. When Si is employed instead of Ge for a buffer layer, less incident light is absorbed, which increases the amount of light absorbed by the active layers of the device (e.g., the a-Si:H layer stack).

It should be understood that the power (W) or power density ($W/cm^2$) values recited herein are provided as examples. The powers given are not absolute values and may change for different tools and conditions. The power/power densities given here represent those tested to provide a buffer structure and location of work function for the buffer layer between adjacent materials. For example, using Si:H as a material for the buffer layer, the power/power densities are selected to provide a specific morphology that reduced light degradation.

It is to be further understood that the present invention will be described in terms of a given illustrative architecture having substrates and photovoltaic stacks; however, other architectures, structures, substrates, materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design for a photovoltaic device may be created for integrated circuit integration or may be combined with components on a printed circuit board. The circuit or board may be embodied in a graphical computer programming language, and stored in a computer storage medium (such as a disk, tape, physical hard drive, or virtual hard drive such as in a storage access network). If the designer does not fabricate chips or photovoltaic devices, the designer may transmit the resulting design by physical means (e.g., by providing a copy of the storage medium storing the design) or electronically (e.g., through the Internet), directly or indirectly.

Methods as described herein may be used in the fabrication of photovoltaic devices and/or integrated circuit chips with photovoltaic devices. The resulting devices/chips can be distributed by the fabricator in raw wafer form (that is, as a single wafer that has multiple unpackaged devices/chips), as a bare die, or in a packaged form. In the latter case, the device/chip is mounted in a single chip package (such as a plastic carrier, with leads that are affixed to a motherboard or other higher level carrier) or in a multichip package (such as a ceramic carrier that has either or both surface interconnections or buried interconnections). In any case, the devices/chips are then integrated with other chips, discrete circuit elements, and/or other signal processing devices as part of either (a) an intermediate product, such as a motherboard, or (b) an end product. The end product can be any product that includes integrated circuit chips, ranging from toys, energy collectors, solar devices and other applications including computer products or devices having a display, a keyboard or other input device, and a central processor.

It should be further understood that material compounds will be described in terms of listed elements, e.g., SiC, etc. These compounds include different proportions of the elements within the compound, e.g., $Si_xC_y$, where $x/y \neq 1$, etc. In addition, other elements may be included in the compound and still function in accordance with the present principles.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Figure 1:
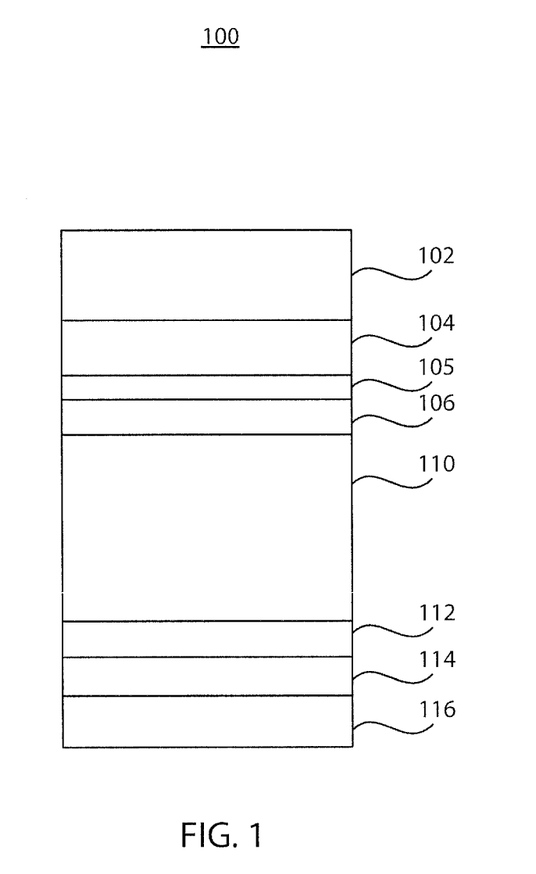
FIG. 1 is a cross-sectional view of a photovoltaic device with a buffer layer formed in accordance with the present principles.

Referring now to the drawings in which like numerals represent the same or similar elements and initially to FIG. 1, an illustrative photovoltaic structure 100 is depicted in accordance with one embodiment. The photovoltaic structure 100 may be employed in solar cells, light sensors or other photovoltaic applications. Structure 100 includes a substrate 102 that permits a high transmittance of light. The substrate 102 may include a transparent material, such as glass, a polymer, etc. or combinations thereof.

A first electrode 104 includes a transparent conductive material. Electrode 104 may include a transparent conductive oxide (TCO), such as, e.g., a fluorine-doped tin oxide ($SnO_2$:F, or "FTO"), doped zinc oxide (e.g., ZnO:Al), indium tin oxide (ITO) or other suitable materials. For the present example, a doped zinc oxide is illustratively employed for electrode 104. The electrode or TCO 104 permits light to pass through to an active light-absorbing material beneath and allows conduction to transport photo-generated charge carriers away from that light-absorbing material. The TCO 104 may be deposited by a chemical vapor deposition (CVD) process, low pressure CVD (LPCVD) process or a plasma-enhanced CVD (PECVD) process. In one embodiment, the TCO 104 may be textured and may include a thickness of about 1 micron, although other thicknesses may be employed.

A buffer layer 105 includes a silicon base material and in particular hydrogenated silicon (Si:H) and may include at least one p-type dopant such as B, Ga, and In. The silicon base layer means that the layer is composed of silicon and its dopants and is not a combination with other base materials. The silicon base layer is distinct in form and chemistry from its adjacent layers. The silicon base layer of buffer layer is formed to have a light transmittance of greater than 80% in visible light. In one embodiment, the buffer layer 105 includes a silicon layer including optionally a p-type dopant and hydrogen. Depending on the work-function of TCO 104, dopant concentration content in the Si:H buffer can be varied. The buffer layer 105 has a greater atomic concentration of silicon than a p-doped layer 106 formed in contact with the buffer layer 105. Employing Si instead or Ge, results in higher transmissivity of the buffer layer 105, e.g., 80% or greater in the visible light spectrum with wavelengths between 380 nm and 750 nm. In addition, Si has fewer structure defects than Ge, which results in better performance.

The buffer layer 105 can be amorphous, microcrystalline, or single crystalline. The buffer layer 105 preferably includes a hydrogenated material, though a non-hydrogenated Si may be employed. The hydrogenation of the material of the buffer layer 105 decreases localized electronic states and increases the conductivity of the buffer layer 105.

The buffer layer 105 can be formed, for example, by a chemical vapor deposition (CVD) process or plasma enhanced chemical vapor deposition (PECVD). The thickness of the buffer layer 105 can be from about 2 nm to about 10 nm, although lesser and greater thicknesses can also be employed. In accordance with the present principles, light degradation of the buffer layer 105 and the device 100 overall can be improved by employing processing parameters or adjustments to the work function of the buffer layer 105.

In one embodiment, the buffer layer 105 is disposed between the electrode 104 and a p-type layer 106. The buffer layer 105 has a material and a process selected to optimize (reduce) light degradation. In accordance with the findings of the present inventors, a work function for the buffer layer 105 preferably has a value that falls in between work function values of the electrode 104 and the p-type layer 106. Preferably, the work function value falls directly in the middle between the work function of the electrode 104 and the work function of the p-type layer 106. For example, if the work function of the electrode 104 is A, and the work function of the p-type layer is B, the work function of the buffer layer should be about $((B-A)/2)+A$ (e.g., the middle). The work function of the buffer layer 105 should be within about 10% of the middle, although greater or lesser energies may be employed.

In one example, a work function of TCO 104 is about 4.5 eV and the work function of the p-type layer 106 (e.g., p+ a-SiC:H) is approximately 5.7 eV. A work function of the Si buffer layer 105 (Si:H) should be approximately between 4.5 eV and 5.7 eV (e.g., 4.7-5.6 eV for p type a-Si depending on doping level). This can be achieved by, e.g., adjusting the amount of p-type dopant gas (e.g., diborane ($B_2H_6$)), adjusting a deposition power to below, e.g., 50 W or a power density below 0.2 W/cm². In one particularly, useful embodiment, the power is less than or equal to about 25 W or a power density of about 0.1 W/cm². Any highly conductive buffer layer 105 whose work function is located between the work function of the TCO 104 and the work function of the p-type layer works very well to provide a high fill factor (FF) of an a-Si:H solar cell device.

In one embodiment, the buffer layer 105 may be formed by a silane ($SiH_4$) plasma enhanced deposition. The low power deposition includes a power density of less than about 0.2 W/cm² and preferably less than about 0.1 W/cm², and more preferably less than about 0.01 W/cm². The low power PECVD results in greater resistance to light degradation. In addition, the lower power deposition process is more manufacturing-friendly as less energy is used, and thermal budget is maintained. The low power process sacrifices initial device efficiency for longer term device efficiency. That is to say, the stable efficiency, which means the final efficiency after light degradation, can be higher in low power processed solar cells than high power processed solar cells, although initial efficiency immediately after solar cell deposition is usually higher in solar cells with high power depositions due to higher crystallinity (e.g., higher conductivity occurs when using high power process).

In one embodiment, the buffer formation process may include PECVD at a deposition temperature of less than 400 degrees C. and more preferably below 250 degrees C. The deposition may include a hydrogenated amorphous silicon buffer layer configured to have a work function with a value within about ±10% of the middle of the barrier formed by adjacent layers. In one example, the buffer layer deposition gas ratio may include $SiH_4/H_2$ at about 100 for a hydrogenated silicon (Si:H). The buffer layer is preferably doped with B, or other group V materials (e.g., Ga, In). For B doping, diborane ($B_2H_6$) or trimethyl borate ($B(OCH_3)_3$) is preferred. The buffer layer deposition gas ratio for boron doping using diborane may include $B_2H_4/H_2$ at about 2.75.

In addition to low power deposition, low deposition rate has resulted in less light degradation. In one embodiment, the PECVD process deposits the buffer layer 105 at a deposition rate of between about 1 Angstrom/sec to 2 Angstrom/sec, although other deposition rates are contemplated, but preferably less than about 100 Angstrom/sec. For the buffer layer deposition, low deposition rate is maintained by a high dilution ratio ($SiH_4:H_2$) of more than 1:50. High dilution and a low deposition rate permits more thorough passivation of hydrogen on broken silicon bonds, which results in less light degradation.

The p-doped layer 106 includes an amorphous, microcrystalline, or single-crystalline p-doped silicon-containing material. The p-doped layer 106 can be a p-doped silicon layer including silicon and at least one p-type dopant and optionally hydrogen; a p-doped silicon-germanium alloy layer including silicon, germanium, at least one p-type dopant and optionally hydrogen; a p-doped silicon-carbon alloy layer including silicon, carbon, at least one p-type dopant and optionally hydrogen; or a p-doped silicon-germanium-carbon alloy layer including silicon, germanium, carbon, at least one p-type dopant and optionally hydrogen.

In some cases, the p-doped layer 106 may include a hydrogenated amorphous, microcrystalline, or single-crystalline p-doped silicon-containing material. The presence of hydrogen in the p-doped layer 106 can increase the concentration of free charge carriers, i.e., holes, by delocalizing the electrical charges that are pinned to defect sites. A hydrogenated p-doped silicon-containing material can be deposited in a process chamber containing a silicon-containing reactant gas as a carrier gas. To facilitate incorporation of hydrogen in the hydrogenated p-doped silicon-containing material, a carrier gas including hydrogen can be employed. Hydrogen atoms in the hydrogen gas within the carrier gas are incorporated into the deposited material to form an amorphous or microcrystalline hydrogenated p-doped silicon-containing material of the p-doped layer 106.

In one embodiment, p-doped or p-type layer 106 includes boron as a dopant, although other p-type materials or dopants may be employed. Layer 106 may be deposited using diborane gas, trimethylborane or other gases. The p-type layer 106 may have a thickness of between about 5-20 nm. In particularly useful embodiments, layer 106 includes amorphous SiC although microcrystalline SiC:H, amorphous Si:H or microcrystalline Si:H may also be employed.

It should be noted that since the buffer layer 105 and the p-type doped layer 106 include Si, these two and other layers can be formed using a same source. This differs from employing a Ge buffer layer, which needs to employ an additional Ge source.

Processing continues with formation of an intrinsic layer 110 formed on layer 106 of compatible material. Intrinsic layer 110 may be undoped and may include an amorphous silicon material, e.g., hydrogenated amorphous Si (a-Si:H). The intrinsic layer 110 may include a thickness of between about 100-300 nm, although other thicknesses are contemplated. The intrinsic layer 110 may include, e.g., a-Si:H or a hydrogenated amorphous silicon carbide (a-SiC:H) and may be deposited by a chemical vapor deposition (CVD) process, or a plasma-enhanced (PECVD). The a-Si:H may be deposited from silane gas and hydrogen gas.

A doped layer 112 (e.g., an n-type layer) is formed on the intrinsic layer 110. Layer 112 may include an n-type Si containing layer, e.g., a hydrogenated microcrystalline Si (μc-Si: H), a crystalline Si or an a-Si layer. Layer 112 may be deposited by a CVD process, or a PECVD process. The n-type layer 112 may have a thickness of between about 5-20 nm.

A bottom electrode 114 may be formed using TCO material. The bottom electrode 114 may include, e.g., ZnO and include a thickness of between 70 nm and 150 nm. The thickness may be affected depending on whether a back reflector is employed. A back reflector 116 may be formed using a reflective metal, such as Ag, Al, Au, etc. A suitable metal deposition process may be employed, e.g., physical or chemical vapor deposition, sputtering, electro or electroless plating, etc. The back reflector 116 may have a thickness of between about 100 to 200 nm. It should be understood that other material selections, layers, structures, etc. may be employed in device 100 including additional back reflectors or instead of back reflectors, tandem cells, etc.

Figure 2:
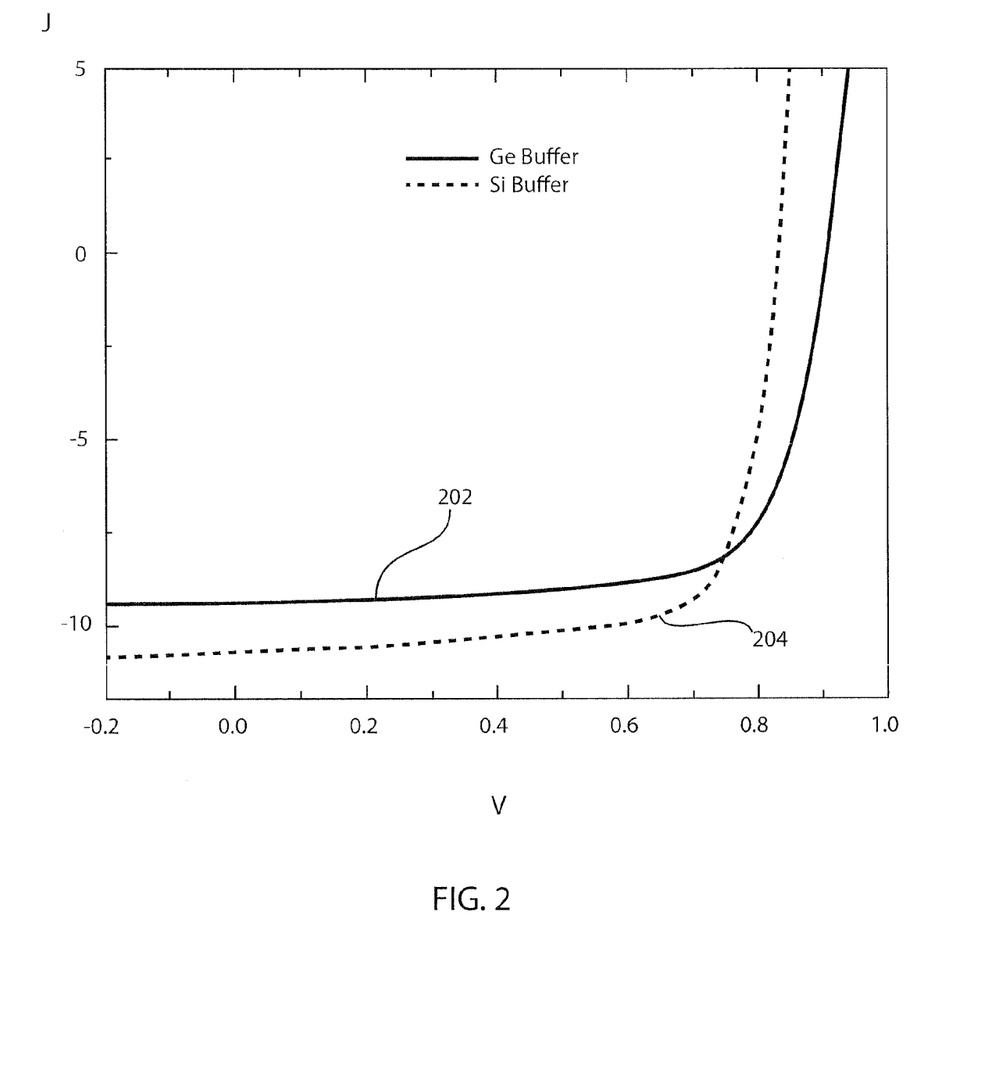
FIG. 2 is a diagram showing current density versus voltage for a device with a Ge buffer layer and a device with a Si buffer layer in accordance with the present principles.

Referring to FIG. 2, a plot of current (mA) versus voltage (V) is shown for an a-Si:H device with a Ge buffer (plot 202) and an a-Si:H device with a Si buffer (plot 204). The Si buffer in this example was deposited with a gas ratio: $B_2H_6/SiH_4=2.75$. The plots 202 and 204 show higher performance for the Si buffer over the Ge buffer. Table 1 shows processing conditions and characteristics of the devices associated with FIG. 2. $V_{oc}$ is open circuit voltage and $J_{sc}$ is short circuit current density.

TABLE 1

| Ge Buffer | Si Buffer |
|---|---|
| FF = 72.087% | FF = 72.872% |
| Efficiency = 6.080% | Efficiency = 6.478% |
| $V_{oc}$ = 902.438 mV | $V_{oc}$ = 828.551 mV |
| $J_{sc}$ = 9.346 mA/cm$^2$ | $J_{sc}$ = 10.729 mA/cm$^2$ |
| Deposition power = 500 W | Deposition power = 25 or 50 W |
| Deposition rate = 5.3 Angstroms/sec | Deposition rate = 1 Angstroms/sec |

Figure 3:
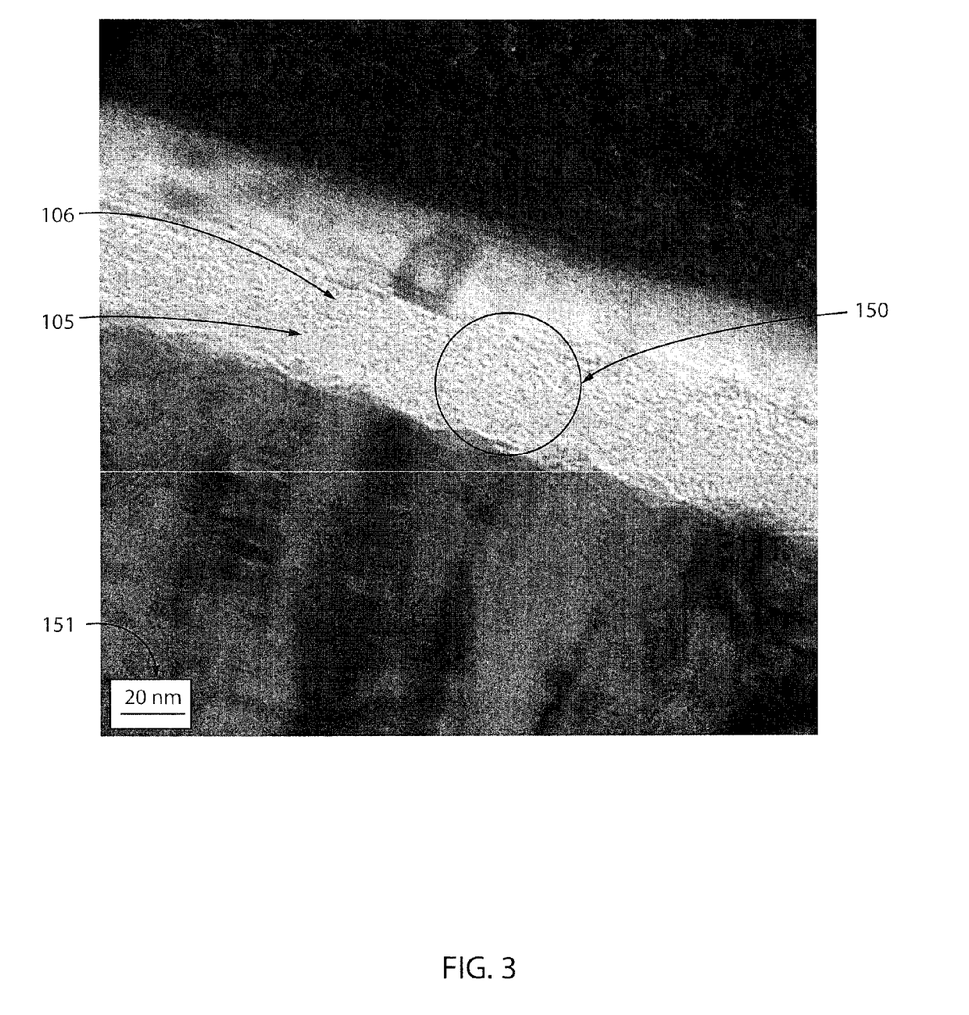
FIG. 3 depicts a high-resolution transmission electron microscopy (HRTEM) image highlighting a buffer layer and p-type layer interface region in accordance with the present principles.

Referring to FIG. 3, a high-resolution transmission electron microscopy (HRTEM) image is shown highlighting a region of interest 150. The region of interest 150 includes a-Si:H buffer layer 105 and a p-type doped layer 106. The Si:H buffer 105 shows a unique atomic structure which is different from the structure of the p-type doped layer 106. A ZnO electrode 104 is also shown as well as an intrinsic layer 110. A scale 151 showing 20 nm is indicated in the image.

Figure 4:
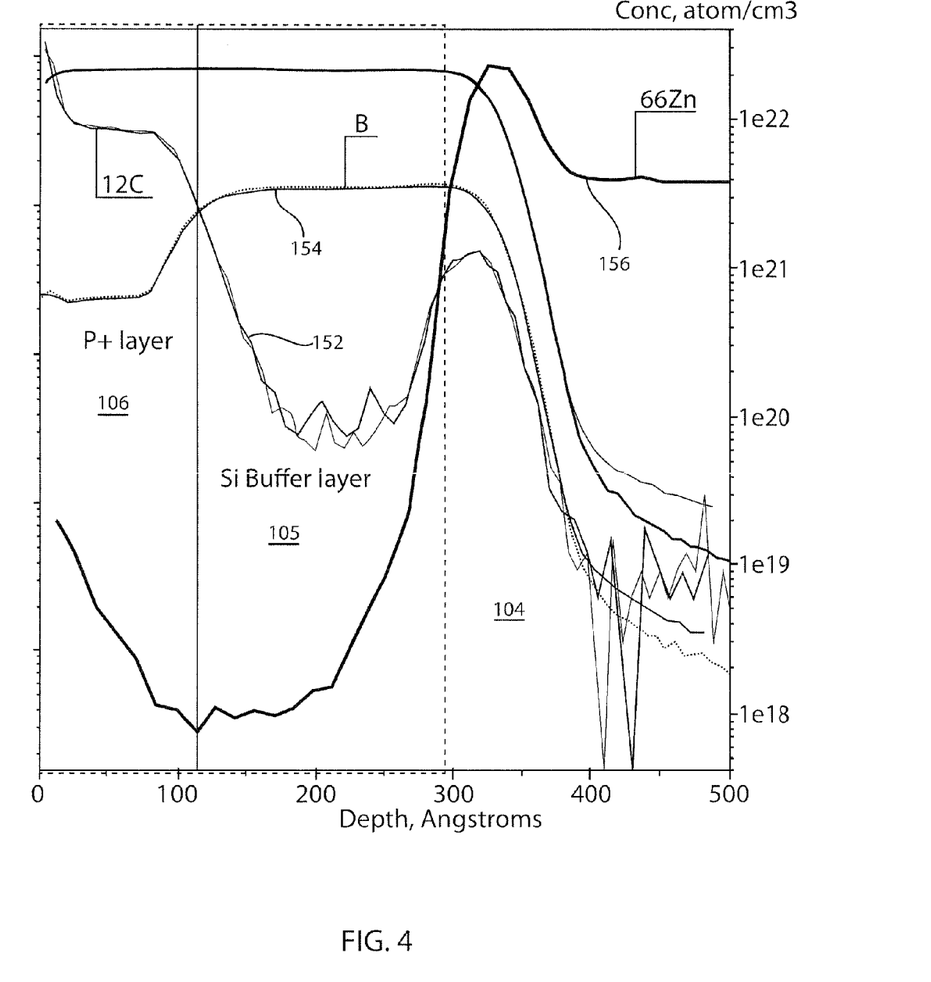
FIG. 4 depicts a secondary ion mass spectroscopy (SIMS) analysis on a buffer layer and p-type layer interface region for C, B and Zn in accordance with the present principles.

Referring to FIG. 4, a secondary ion mass spectroscopy (SIMS) was conducted on the structure depicted in FIG. 3 for elements C, B and Zn and shows concentration (Conc, atoms/cm$^{-3}$) versus depth in Angstroms (A). The p-type doped layer 106 and buffer layer 105 are clearly resolved in a bilayer configuration upon removal of any Al. The p-type doped layer 106 includes SiC with a high dopant concentration of C (e.g., $8.4 \times 10^{21}$ cm$^{-3}$ (or 16.8 at %) indicated by carbon line 152 and a lower concentration of B (e.g., $6.3 \times 10^{21}$ cm$^{-3}$) indicated by boron line 154. The Si buffer layer 105 includes a lower concentration of C (e.g., $8.0 \times 10^{19}$ cm$^{-3}$) indicated by carbon line 152 and a high concentration of B (e.g., $3.5 \times 10^{21}$ cm$^{-3}$ (or 7.0 at %)) indicated by boron line 154). In this embodiment, the buffer layer 105 is a B doped amorphous Si buffer (e.g., a-Si:B). Zn is indicated by a zinc line 156, which is high in the ZnO electrode 104.

Figure 5:
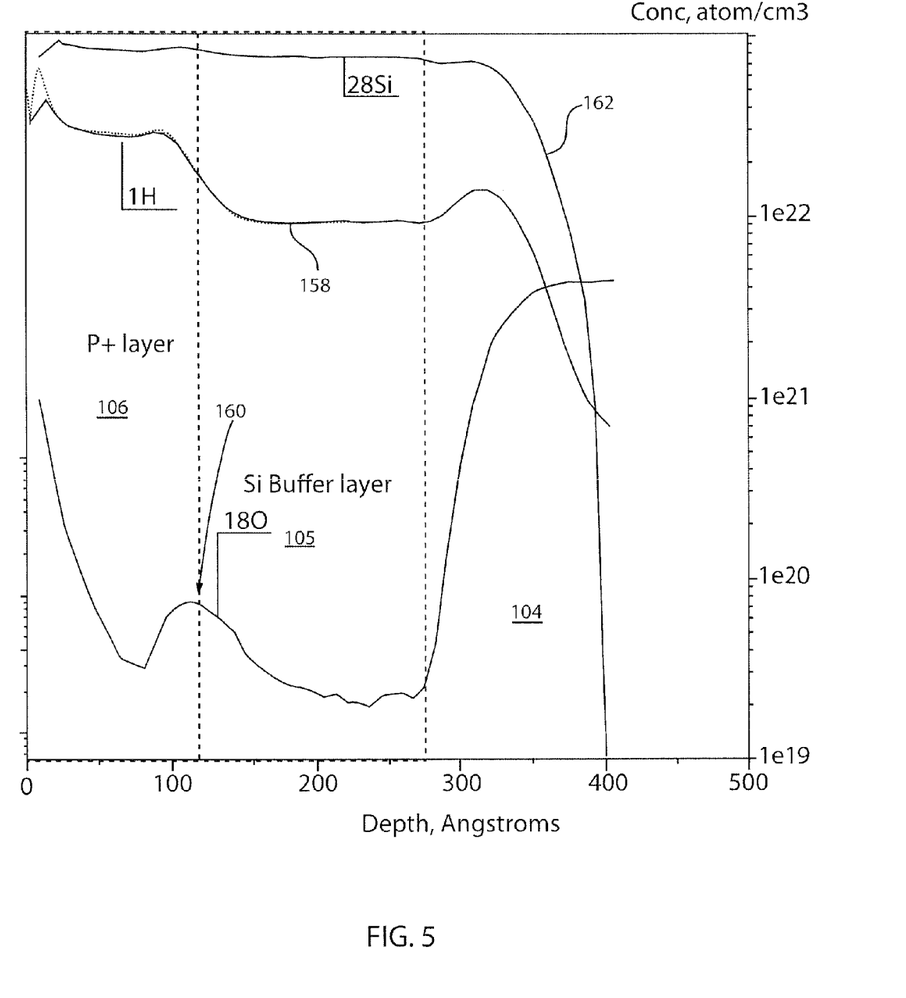
FIG. 5 depicts another secondary ion mass spectroscopy (SIMS) analysis on a buffer layer and p-type layer interface region for H, Si and O in accordance with the present principles.

Referring to FIG. 5, another secondary ion mass spectroscopy (SIMS) was conducted on the structure depicted in FIG. 3 for elements Si, H and O and shows concentration (Conc, atoms/cm$^{-3}$) versus depth in Angstroms (A). The p-type doped layer 106 and buffer layer 105 are clearly resolved in a bilayer configuration with regards to a hydrogen line 158 and an oxygen line 160. The p-type doped layer 106 includes a high concentration of H (e.g., mean concentration=$2.8 \times 10^{22}$ cm$^{-3}$ (or 56.0 at % assuming Si atomic density)) indicated by the hydrogen line 158. The Si buffer layer 105 includes a lower concentration of H (e.g., mean concentration=$9.2 \times 10^{21}$ cm$^{-3}$ (or 18.4 at %)). A small O interface exists between the layers 105 and 106 indicated by oxygen line 160, which is high in the ZnO electrode 104. Si is roughly constant across the layers 105 and 106 as indicated by line 162.

In particularly useful embodiments, the buffer layer 105 is a distinct Si layer separate from the p-type layer 106. For example, carbon concentration in the buffer layer 105 is about 100 times less than carbon concentration in the p-type layer 106 when SiC is employed for the p-type layer 106. When the buffer layer 105 includes boron doping, boron concentration in the buffer layer 105 is between 5 times to 10 times greater than boron concentration in a B-doped p-type layer 106. When the buffer layer 105 includes hydrogen, hydrogen concentration in the buffer layer 105 is between 2 times to 3 times less than hydrogen concentration in the p-type layer 106.

In accordance with the usage of a Si buffer layer, light degradation is significantly reduced as indicated by efficiency degradation. Table 2 shows experimental results for devices fabricated using a lower power deposition (25 W) and a higher power deposition (50 W). In accordance with one illustrative example, light degradation efficiency is reduced from 8.8% using a deposition power of 50 W to light degradation efficiency of 0.14% using a deposition power of 25 W. These results are conservative as improvements in light induced efficiency degradation can be even greater.

In contradiction of the trend to increase deposition power, the present inventors have reduced the deposition power for a Si buffer layer and have discovered the light degradation was reduced. Table 2 shows some data collected from cells that were subjected to 88 hours of light soaking (1.5 suns) for samples made with deposition powers of 25 W and 50 W in accordance with the present principles. Before the degradation process (88 hours of light soaking), an initial efficiency was measured followed by a measurement of stable efficiency for each power level.

TABLE 2

Device comparison for devices formed by different deposition powers using a Si buffer.

| Deposition Power | FF | Efficiency degradation | Initial Efficiency before light soaking (88 hours) | Stable Efficiency after light soaking (88 hours) |
|---|---|---|---|---|
| 25 W | 69.5195% | 0.14% | 6.279% | 6.270% |
| 50 W | 68.8795% | 8.8% | 6.686% | 6.098% |

Fill factor (FF) is a ratio of the maximum power point ($P_m$) divided by open circuit voltage ($V_{oc}$) and short circuit current ($J_{sc}$):

$$FF = \frac{P_m}{V_{oc}J_{sc}}.$$

Higher open circuit voltage provides greater efficiency if other parameters remain the same. The stable efficiency of the devices made in the lower power process (25 W) is maintained at a higher value over the useful life of the device.

Figure 6:
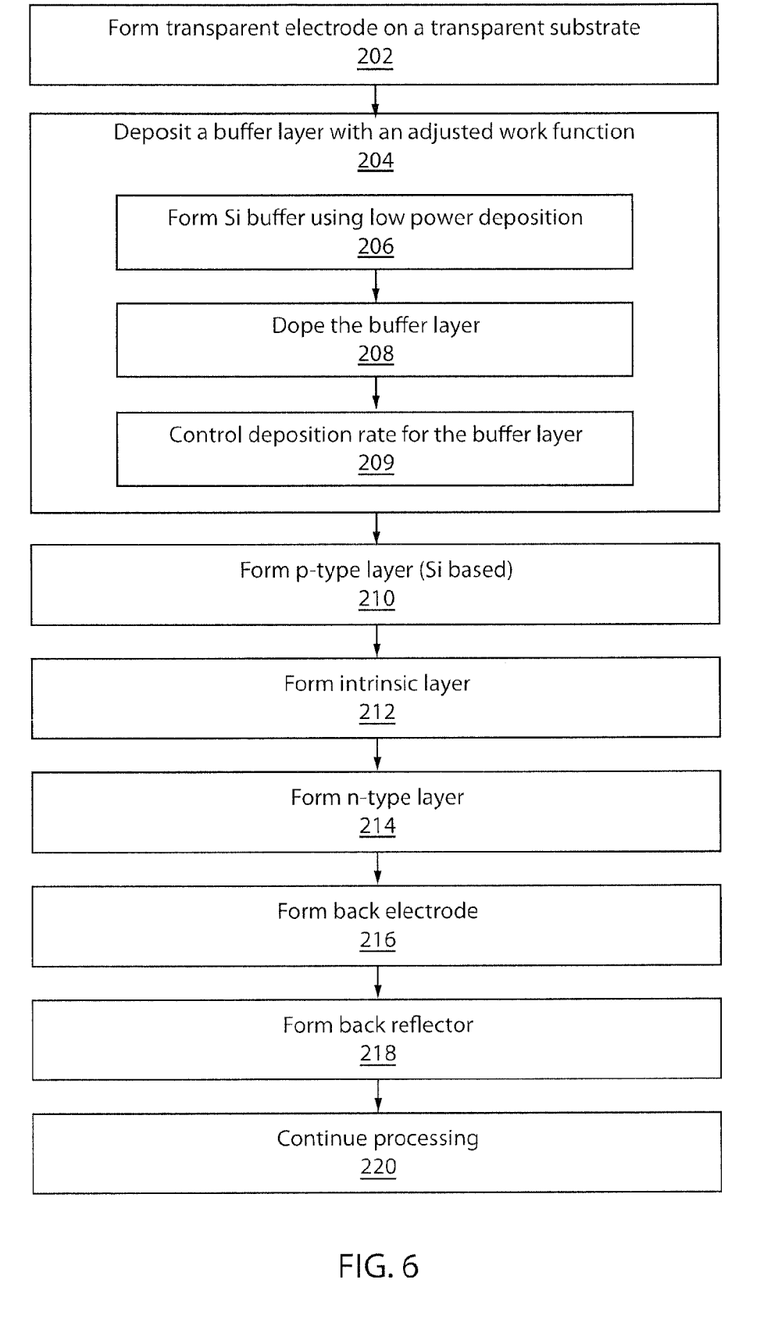
FIG. 6 is a block/flow diagram showing methods for fabricating a photovoltaic device having a buffer layer with an adjusted work function (e.g., by a low deposition rate/low deposition power process) in accordance with illustrative embodiments.

Referring to FIG. 6, methods for forming a photovoltaic device are illustratively shown. It should also be noted that, in some alternative implementations, the functions noted in the blocks may occur out of the order noted in FIG. 6. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

In block 202, a transparent electrode is formed on a transparent substrate. The transparent electrode may include a transparent conductive oxide or the like. In block 204, a buffer is deposited on the transparent electrode. The buffer layer is formed to include a work function that is substantially in the middle of a metal-semiconductor barrier between adjacent layers to provide a greater resistance to light induced degradation. In block 206, the buffer layer is formed from Si by a low deposition power of less than about 50 Watts (power density=0.2 W/cm$^2$). The low deposition power may be less than about 25 Watts (power density=0.1 W/cm$^2$).

The buffer layer may include at least one of a hydrogenated amorphous silicon, a hydrogenated microcrystalline silicon, a hydrogenated nanocrystalline silicon, a boron-containing amorphous silicon, a boron-containing microcrystalline silicon, a boron-containing nanocrystalline silicon, combinations of hydrogen and boron in a silicon base material, combinations of boron and other dopants in a silicon base material, combinations of hydrogen and other dopants in a silicon base material, a silicon base material with other dopant specifies, etc. The silicon base material may also include a crystalline (monocrystalline form) or a noncrystalline form, e.g., microcrystalline nanocrystalline, amorphous. The nanocrystalline and/or microcrystalline forms of Si may be employed if their work functions are properly adjusted toward the middle of the barrier. The buffer layer is preferably deposited by a plasma enhanced chemical vapor deposition process, although other processes may be employed.

In block 208, depositing the buffer layer includes forming the buffer layer with one or more of the following dopants: H, B, Ga, and In. The buffer layer may be formed by CVD or PECVD. Low power PECVD is preferred. The buffer layer may be formed by in-situ doping (or other doping technique) and/or with a hydrogen source to produce a germanium free doped hydrogenated silicon buffer layer. During the deposition process, a deposition rate is controlled to enhance light degradation resistance. While a deposition rate of less than 100 is preferred, a deposition rate of between about 1 and 2 Angstroms per second provides significant light degradation resistance and improved long-term efficiency of the photovoltaic device. This may also be due to the adjustment in the deposition power of the buffer layer to locate the work function in the middle of a barrier between the adjacent materials.

In block 210, a p-type layer is deposited or formed on the buffer layer. The buffer layer bridges or aligns a Fermi level ($E_F$) with the transparent electrode. Conduction band energies between the buffer layer and the p-type layer are also aligned. This better transitions the differential between energy barriers of the transparent electrode and the p-type layer. The p-type layer includes a silicon containing material. The p-type layer may include at least one of amorphous silicon, amorphous silicon carbide, hydrogenated amorphous silicon, or hydrogenated amorphous silicon carbide.

In one embodiment, the p-type layer includes boron-doped hydrogenated amorphous silicon carbide, and the buffer layer includes boron-doped hydrogenated amorphous silicon. In such a case, preferred characteristics include the following. Carbon concentration in the buffer layer is about 100 times less than carbon concentration in the p-type layer, boron concentration in the buffer layer is between 5 times and 10 times greater than boron concentration in the p-type layer and hydrogen concentration in the buffer layer is between 2 times and 3 times less than hydrogen concentration in the p-type layer.

In block 212, an intrinsic layer is formed on the p-type layer. In block 214, an n-type layer is formed on the intrinsic layer. In block 216, a back electrode is formed on the n-type layer. The back electrode may include a transparent conductive oxide. In block 218, a back reflector or back reflectors may be formed.

In one embodiment, the p-type layer includes a form of silicon (e.g., a-Si, a-Si:H, a-SiC, a-SiC:H, crystalline forms of Si or SiC, etc.). The intrinsic layer may include a-Si, a-Si:H, or crystalline forms of Si, etc. The n-type layer may include an n-doped form of a-Si, a-Si:H, or crystalline forms of Si, etc.

In block 220, processing continues to complete the photovoltaic device.

Having described preferred embodiments for a buffer layer for high performing and low light degraded solar cells (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A photovoltaic device, comprising:
    a transparent electrode formed on a transparent substrate;
    a buffer layer formed on the transparent electrode, the buffer layer being formed from a non-crystalline doped hydrogenated silicon layer having a work function ranging from 4.7 eV to 5.6 eV;
    a p-type layer of silicon containing material formed on the buffer layer such that the work function of the buffer layer falls substantially in the middle +/−10% of a barrier formed between the transparent electrode and the p-type layer, wherein the p-type layer of silicon containing material has a composition selected from the group consisting of amorphous SiC, microcrystalline SiC:H, microcrystalline Si:H and combinations thereof; and
    an intrinsic layer formed on the p-type layer;
    an n-type layer formed on the intrinsic layer; and
    a back electrode formed on the n-type layer, wherein light degradation of the photovoltaic device is limited to less than 8.8% within a light soak up to approximately 90 hours, wherein the plasma power for depositing at least one of the buffer layer and the p-type layer of silicon containing material by plasma enhanced chemical vapor deposition does not exceed 50 W.

2. The device as recited in claim 1, wherein the buffer layer is amorphous silicon.

3. The device as recited in claim 1, wherein the buffer layer includes one or more of B, Ga, and In dopants.

4. The device as recited in claim 1, wherein the p-type layer includes boron-doped hydrogenated amorphous silicon carbide and the buffer layer includes boron-doped hydrogenated amorphous silicon, and wherein carbon concentration in the buffer layer is about 100 times less than carbon concentration in the p-type layer, boron concentration in the buffer layer is between 5 times and 10 times greater than boron concentration in the p-type layer and hydrogen concentration in the buffer layer is between 2 times and 3 times less than hydrogen concentration in the p-type layer.

5. A solar cell structure, comprising:
    a glass substrate;
    a transparent electrode formed on the glass substrate;
    a buffer layer of hydrogenated silicon formed on the transparent electrode having a work function ranging from 4.7 eV to 5.6 eV, the hydrogenated silicon layer and having a light transmittance of greater than 80% in visible light;
    a p-type layer of silicon containing material formed on the buffer layer such that the work function of the buffer layer falls substantially in the middle +/−10% of a barrier formed between the transparent electrode and the p-type layer, wherein the p-type layer of silicon containing material has a composition selected from the group consisting of amorphous SiC, microcrystalline SiC:H and microcrystalline Si:H; and
    an intrinsic layer formed on the p-type layer;
    an n-type layer formed on the intrinsic layer; and
    a back electrode formed on the n-type layer, wherein light degradation of the solar cell is limited to less than 8.8% within a light soak up to approximately 90 hours, wherein the plasma power for depositing at least one of the buffer layer and the p-type layer of silicon containing material by plasma enhanced chemical vapor deposition does not exceed 50 W.

6. The cell as recited in claim 5, wherein the buffer layer amorphous silicon.

7. The cell as recited in claim 5, wherein the buffer layer includes one or more of B, Ga and In dopants.

8. The photovoltaic device of claim 1, wherein the light degradation of the photovoltaic device is less than 8.8% and greater than 0.14%.

9. The solar cell structure of claim 5, wherein the light degradation of the photovoltaic device is less than 8.8% and greater than 0.14%.

* * * * *